United States Patent
Gao et al.

(10) Patent No.: US 8,518,479 B2
(45) Date of Patent: Aug. 27, 2013

(54) FABRICATION OF FLUIDIC FEATURES WITHIN A PLASTIC SUBSTRATE

(75) Inventors: Chuan Gao, Sunnyvale, CA (US); Tianyue Yu, San Jose, CA (US)

(73) Assignee: Affymetrix, Inc., Santa Clara, CA (US)

( * ) Notice: Subject to any disclaimer, the term of this patent is extended or adjusted under 35 U.S.C. 154(b) by 761 days.

(21) Appl. No.: 11/867,879

(22) Filed: Oct. 5, 2007

(65) Prior Publication Data

US 2013/0029273 A1 Jan. 31, 2013

Related U.S. Application Data

(60) Provisional application No. 60/851,797, filed on Oct. 12, 2006.

(51) Int. Cl.
*B05D 1/34* (2006.01)
*B05B 12/00* (2006.01)

(52) U.S. Cl.
USPC .......... 427/235; 427/230; 427/508; 427/256; 427/271; 118/641; 118/642; 118/643

(58) Field of Classification Search
USPC ............... 427/256, 230, 235, 508; 118/641, 118/642, 643
See application file for complete search history.

(56) References Cited

U.S. PATENT DOCUMENTS

| 5,219,712 | A * | 6/1993 | Evans et al. ............ 430/311 |
| 6,143,496 | A * | 11/2000 | Brown et al. ............ 435/6 |
| 6,271,145 | B1 * | 8/2001 | Toda ................ 438/706 |
| 2001/0045358 | A1 * | 11/2001 | Kopf-Sill et al. ........ 204/452 |
| 2002/0094533 | A1 * | 7/2002 | Hess et al. ............ 435/6 |
| 2002/0095073 | A1 * | 7/2002 | Jacobs et al. ........... 600/300 |
| 2003/0027344 | A1 * | 2/2003 | Kim et al. ............ 436/46 |
| 2004/0028580 | A1 * | 2/2004 | Futami et al. .......... 422/211 |
| 2008/0075954 | A1 * | 3/2008 | Wardle et al. ........ 428/339 |

OTHER PUBLICATIONS

Kenis et al., Fabrication inside Microchannels Using Fluid Flow, Accounts of Chemical Research, (2000).*
Oosterbroek et al., Lab-on-a-Chip, Elsevier, (2003).*
Paul J.A. Kenis et al, "Microfabrication Inside Capillaries Using Multiphase Laminar Flow Patterning," Science 285, 83 (1999).

* cited by examiner

*Primary Examiner* — Nathan Empie
*Assistant Examiner* — Lisha Jiang
(74) *Attorney, Agent, or Firm* — Affymetrix, Inc.

(57) ABSTRACT

In one aspect of the invention, methods, and devices are provided for creating microfluidic and nanofluidic features. In some embodiments, such methods and devices are used to create at least one channel of a desired volume within a channel in a plastic substrate.

12 Claims, 10 Drawing Sheets

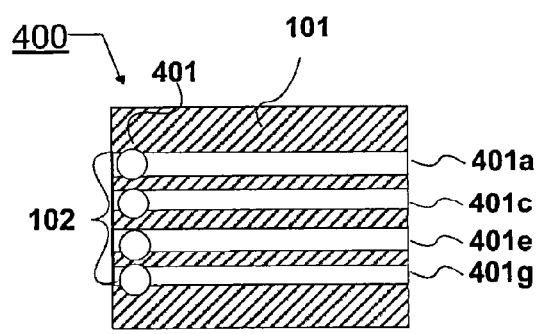
FIG. 5c
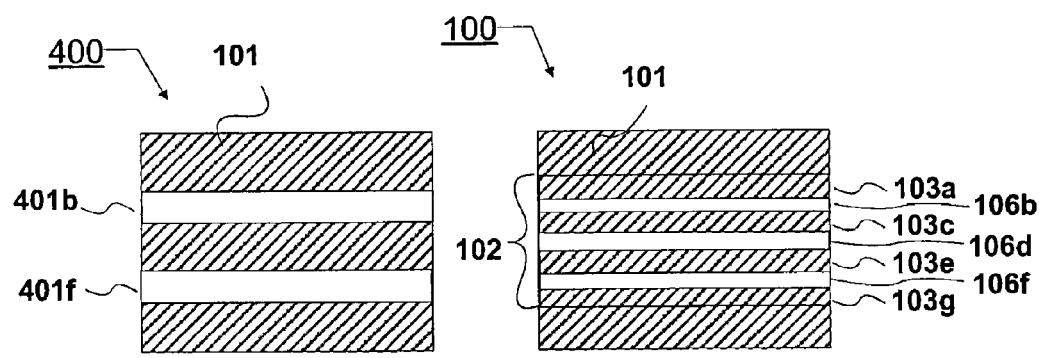
FIG. 5b
FIG. 5a
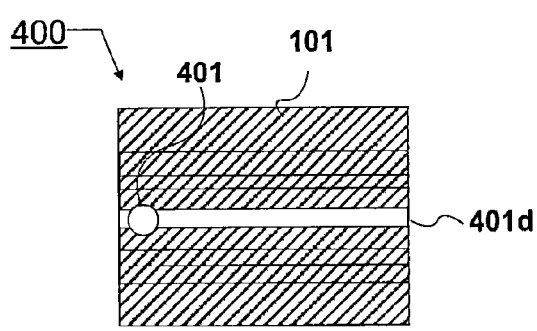
FIG. 5d

FABRICATION OF FLUIDIC FEATURES WITHIN A PLASTIC SUBSTRATE

RELATED APPLICATIONS

The present application claims priority from U.S. Provisional Patent Application Ser. No. 60/851,797, filed Oct. 12, 2006 and is hereby incorporated by reference herein in its entirety for all purposes.

BACKGROUND OF THE INVENTION

The present invention relates to the field of micro and nanofluidices. For example, the methods and devices of the present invention can be used to manufacture microfluidic features, specifically in manufacturing microchannels and nanochannels in plastic substrates.

Interest has been growing in the fabrication of microfluidic devices. Typically, advances in the semiconductor manufacturing arts have been translated to the fabrication of micromechanical structures, e.g., micropumps, microvalves and the like, and microfluidic devices including miniature chambers and flow passages.

There are several techniques that have been developed to fabricate microfluidic channels on materials such as, for example, silicon, glass, quartz, polymeric films, silicon carbide and thermoplastic. Techniques such as, for example, chemical wet etch, chemical etch, laser cutting, laminate laser cutting, micromolding, photopolymerization, hot embossing and injection molding are current methods of fabricating fluidic features, however, have feature size limitations, cost issues and may not be appropriate to be used on plastic materials when fabricating features, such as channels, at the smaller size ranges described in this application. In order to fabricate nanochannels, for example, the semiconductor industry has utilized the conventional electron-beam lithography process which is relatively expensive and inherently slow. There is a need to develop a simple method to manufacture microchannels at the lower scale and nanochannels on plastic substrates at a lower cost and at a higher throughput.

BRIEF SUMMARY OF THE INVENTION

An embodiment of the present invention provides methods and devices for constructing at least one channel of a desired volume in a plastic substrate. At least one fluid that is curable is introduced into the channel in the substrate by a dispensing mechanism. The channel of a desired volume to be created comprises a width which is varied to provide a desired volume. A curing mechanism cures at least one fluid such that an alternating pattern of the cured material creates at least one channel of a desired volume within the channel in a substrate.

According to a another embodiment of the present invention, the methods and devices further include a second fluid, wherein the second fluid is immiscible with the first fluid. In one preferred aspect of the invention, the width is in the range of 100 nanometers to 10 microns. In a more preferred embodiment of the present invention, the width is in the range of 200 nanometers to 1 micron. In a most preferred embodiment of the present invention, the width is approximately 500 nanometers. According to another aspect of the present invention, the first fluid, which is curable, is a UV epoxy material which is cured by a UV curing mechanism while the second fluid is water.

According to an alternate embodiment of the present invention, the channel of a desired volume to be created is an open microchannel. In one aspect of the present invention, the methods and devices further comprise a mask during the curing process to provide an alternating pattern of the cured material. In one preferred aspect of the invention, the width is in the range of 1 micron to 50 microns. In a more preferred embodiment of the present invention, the width is in the range of 5 microns to 20 microns. In a most preferred embodiment of the present invention, the width is approximately 10 microns. In a preferred embodiment, SU-8 is used to create at least one microchannel of a desired volume.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 2a is an image of a channel of a desired volume formed within a channel in a substrate. FIG. 2b illustrates a constructed curved channel of a desired volume. FIG. 2c illustrates multiple channels of a desired volume(s) constructed within a channel in a substrate. FIG. 2d illustrates multiple constructed zigzag types of channels of a desired volume(s). FIG. 2e illustrates a constructed channel of a desired volume within a channel that comprises a well in a substrate.

FIG. 4a illustrates a substrate that comprises both the channel in which the channel of a desired volume will be constructed and the introductory channels. FIG. 4b illustrates a control element that comprises the introductory channels. FIG. 4c illustrates a channel in a substrate wherein the channel of a desired volume will be constructed.

FIGS. 5a-5d illustrate an example of how multiple control elements are used to construct multiple channels of desired volume(s) according to an embodiment of the present invention. FIG. 5a illustrates a channel in a substrate wherein three channels of a desired volume(s) will be constructed using three control elements. FIGS. 5b, 5c, and 5d illustrate the control elements where the introductory channels are provided. The control element as shown in FIG. 5b is attached to the side surface, the control element as shown in FIG. 5c is attached to the top surface and the control element as shown in FIG. 5d is attached to the bottom surface of the substrate with the channel wherein the multiple channels of a desired volume(s) will be created.

FIG. 7a illustrates an example of an open microchannel in a substrate. FIG. 7b illustrates a microchannel filled with a curable material. FIG. 7c illustrates an example of an exposure step. FIG. 7d illustrates the constructed open microchannels of a desired volume(s).

DETAILED DESCRIPTION OF THE INVENTION

I. General Description

The present invention cites certain patents, applications and other references. When a patent, application, or other reference is cited or repeated below, it should be understood that it is incorporated by reference in its entirety for all purposes as well as for the proposition that is recited.

As used in this application, the singular form "a," "an," and "the" include plural references unless the context clearly dictates otherwise.

Throughout this disclosure, various aspects of this invention can be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range. For example, description of a range such as from 1 to 6 should be considered to have specifically disclosed sub ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

II. Specific Embodiments

According to an embodiment of the present invention, methods and devices for constructing at least one channel of a desired volume in a plastic substrate are provided. At least one fluid that is curable is introduced into a channel in the substrate by a dispensing mechanism. The channel of a desired volume to be created comprises a width and the width is varied to provide a desired volume. A curing mechanism cures at least one fluid such that an alternating pattern of the cured material creates at least one channel of a desired volume within the channel in the substrate.

Figure 1:
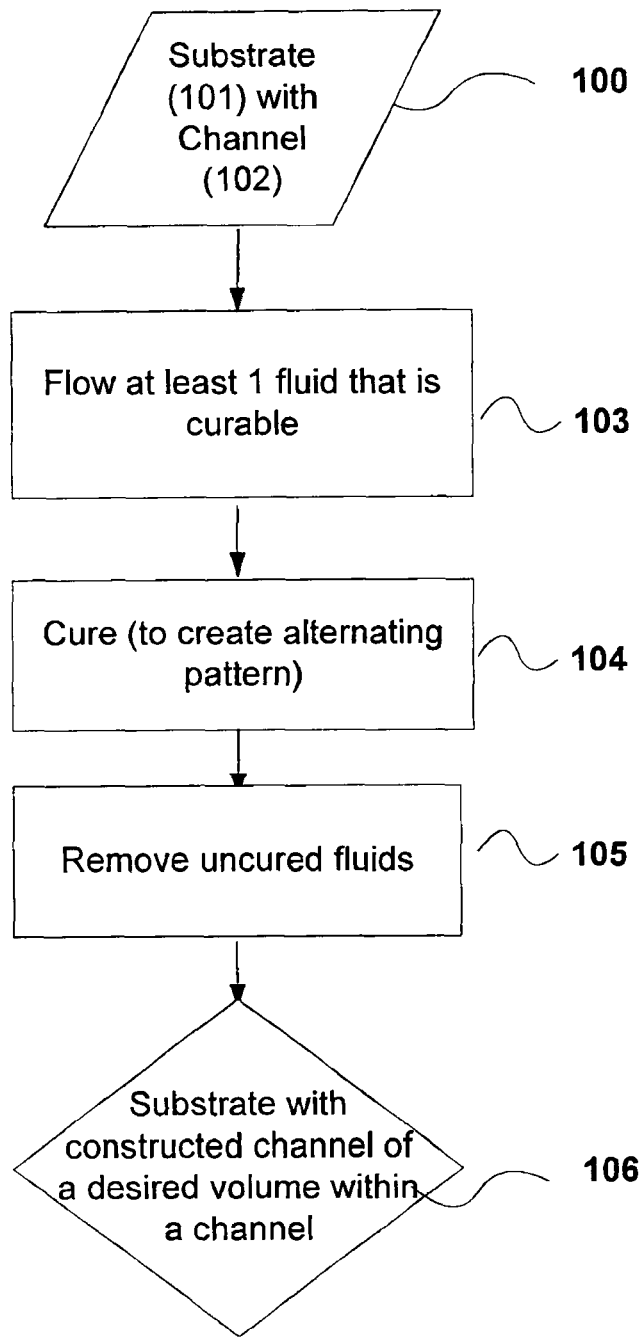
FIG. 1 illustrates an outline showing the steps to construct at least one channel of a desired volume within a channel in a substrate according to an embodiment of the present invention.

According to one aspect of the present invention, the steps of constructing at least one channel of a desired volume within a channel in a substrate is outlined in FIG. 1. The substrate (101) with a channel (102) is provided (100). At least one fluid that is curable is dispensed into the channel in the substrate (103). A curing process is performed (104) such that an alternating pattern of the cured material creates at least one channel of a desired volume within the channel in the substrate. Once the material is cured, any excess material (for example, non-curable material) can be removed (105). A channel of a desired volume is constructed within a channel in a substrate (106).

According to another embodiment of the present invention, the volume(s) of the channel(s) to be constructed can be controlled. In one aspect of the present invention, the channel to be constructed further comprises a width. In a preferred embodiment, the volume of the channel can be controlled by adjusting the width of the channel to be created. There are several parameters that can change the width, for example, flow rate, pressure, temperature, material properties (for example, viscosity).

The channels which can be modified to construct the channels with a desired volume(s) can be in various substrates, which are understood by one skill in the art in various applications, for example, biological, biotechnology, chemical reactions, and the like. Although indicative of a rectangular shape, it will be readily appreciated that the substrate may be embodied in any number of shapes depending upon the particular need. Additionally, these dimensions will typically vary depending upon the number of operations to be performed by the substrate, the complexity of these operations and the like. In general, the substrate is fabricated using one or more of a variety of methods and materials suitable for micro fabrication techniques such as embossing, injection molding, thermal bonding thermal forming, etc. Typical plastic materials used for microfluidics are thermal-plastics: polycarbonate, polymethyl methacrylate (PMMA), COC, etc. and elastomers: polydimethylsiloxane (PDMS). For example, in a preferred embodiment, the body of the device may be injected molded parts from Polycarbonate. According to one embodiment of the present invention, the channel can be in a substrate, for example a microfluidic device such as a lab card (see copending patent application Ser. No. 11/867,909, which is incorporated by reference in its entirety for all purposes).

Figure 2A:
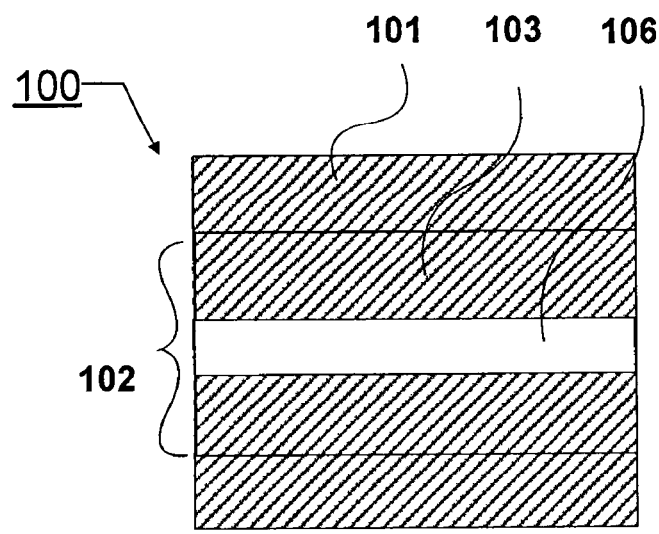
FIGS. 2a-2e illustrate examples of constructed channels of a desired volume(s) according to some embodiments of the present invention.
Figure 2B:
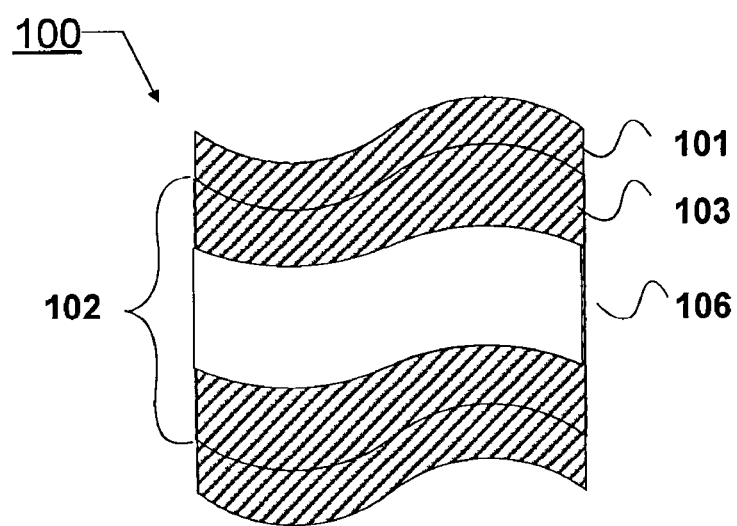
Figure 2C:
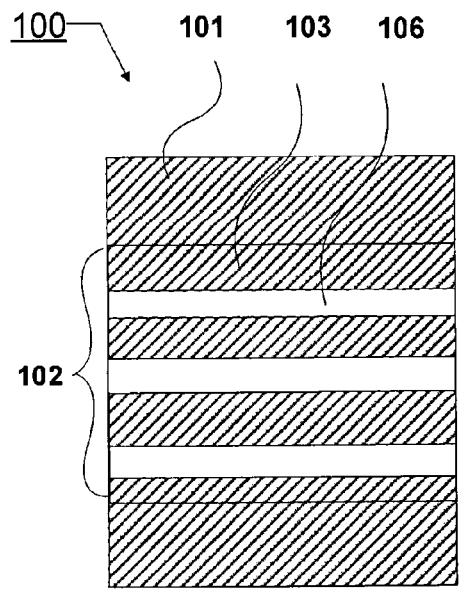
Figure 2D:
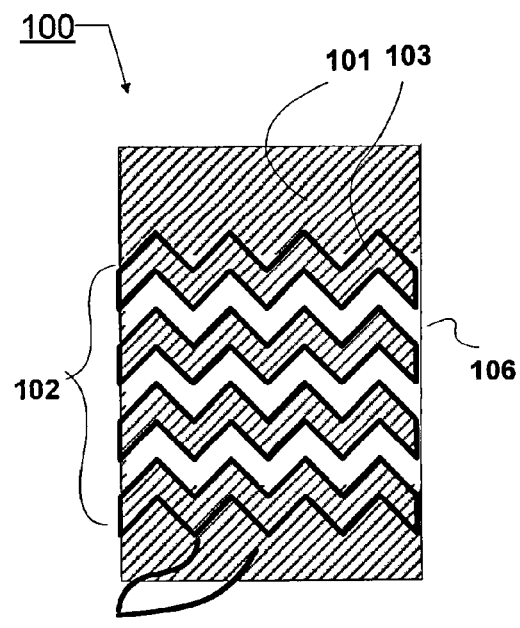
Figure 2E:
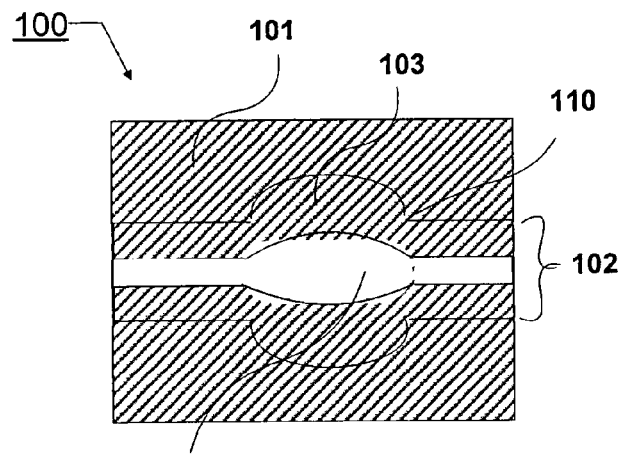

According to another embodiment of the present invention, the configuration of a channel(s) of a desired volume to be constructed can depend on several factors, for example, curing mechanism, the number of fluids, the fluid properties, the pressure, the flow rate, the dispensing mechanism, etc. According to an embodiment of the present invention, various configurations of the channels of a desired volumes can be created. Examples of the various configurations of the constructed channels of a desired volumes (106) within a channel (102) in a substrate (101) are illustrated in FIGS. 2a-2e according to some embodiments of the present invention. These diagrams are merely examples, which should not unduly limit the scope of the claims. One of ordinary skill in the art would recognize many variations, alternatives, and modifications. For example, in this application, the substrate (101) represented in the drawings can also include other features, such as other microfluidic features according to another embodiment of the present invention. A fluid that is curable (103) is dispensed into the channel (102) and cured to construct a channel of a desired volume (106) according to an embodiment of the present invention. FIG. 2a is an image of a channel of a desired volume (106) created within a straight channel (102) in a substrate (101). FIG. 2b illustrates a constructed curved channel of a desired volume (106). Other examples include, L shape channels, V shape channels, funnel type channel, etc. According to another embodiment of the present invention, the method includes a plurality of fluids, for example, a first fluid (103) and a second fluid (106) that flow through the channel in an alternating pattern as shown in FIGS. 2c and 2d. FIG. 2c illustrates multiple constructed channels of a desired volume(s) (106) from within a straight channel (102) in a substrate (101). FIG. 2d illustrates multiple constructed zigzag type channels of a desired volume(s) (106). The channels of a desired volume(s) can be of a different volume from each other according to an embodiment of the present invention. Another example of a variation of the configuration of a channel is illustrated in FIG. 2e. In this case, based on volume requirement and space limitations, a channel of a desired volume is created within a well and a channel. There can be other situations where there might be other complicated and or undesired features such as abrupt features, rough areas, divots, and the like in an area of a substrate that can also be overcome by using the method described above according to another embodiment of the present invention. Examples of abrupt angles (110) are shown in FIG. 2d and FIG. 2e.

The number of channels of a desired volume(s) to be constructed will depend on several factors such as, for example, the size of the channel in the substrate, the shape of the channel, the fluid properties and the like. In general, the channel in the substrate will typically range from about 20 to about 1000 microns wide, preferably, 100 to 500 microns wide and about 5 to 100 microns deep. Although described in terms of channel, it will be appreciated that these chambers may perform a number of varied functions, e.g., as storage chambers, incubation chambers, mixing chambers and the like.

Figure 3:
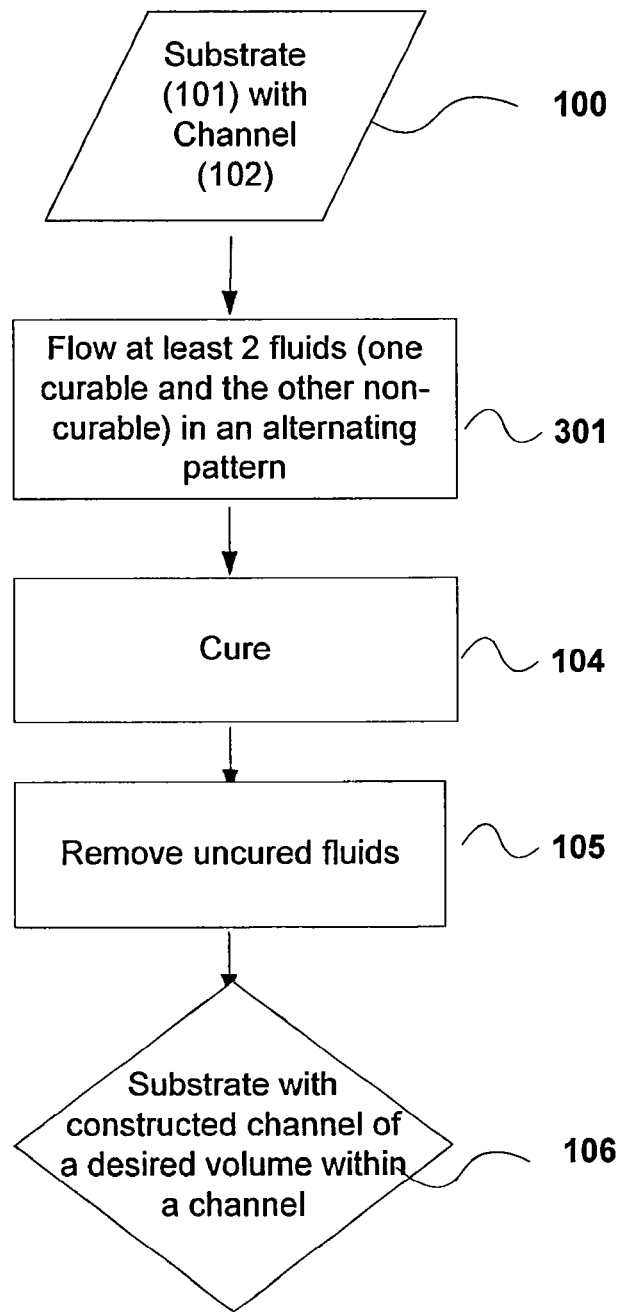
FIG. 3 illustrates an outline showing the steps to construct at least one channel of a desired volume within a channel in a substrate comprising at least 2 fluids according to another embodiment of the present invention.

According to one aspect of the present invention, the steps of another method of constructing at least one channel of a desired volume (106) within a channel in a substrate is outlined in FIG. 3. The substrate (101) with the channel (102) is provided (100), at least two materials where at least one material is curable and other not curable are dispensed into the channel in the substrate (301) in an alternating pattern by a dispensing mechanism. The first fluid is curable and the second fluid is immiscible with the first fluid. The channel is filled with the fluids in an alternating pattern such that they form distinct fluid streams. The parallel laminar flow properties will keep the immiscible fluids separated and dictate the shape of the channels of a desired volume(s) to be created. A curing mechanism cures the first fluid (104), while the fluids are in the channel. Once the first fluid is cured, the second fluid can be removed (105). In performing these process steps, at least one channel of a desired volume is constructed within the channel in the substrate (106). Depending on several factors such as, for example, the curing mechanism, material, application, the dimensions of the channel, the dimensions of a desired constructed channel, the fluids can be static or moving during the curing process according to an embodiment of the present invention.

According to another embodiment of the present invention, the volume(s) of the channel(s) to be constructed can be controlled. In one aspect of the present invention, the channel to be constructed further comprises a width. In a preferred embodiment, the volume of the channel can be controlled by adjusting the width of the channel to be created. There are several parameters that can change the width, for example, flowrate, pressure, temperature, material (for example, viscosity). In a preferred embodiment, the flow rate is adjusted by varying the pressure. For example, the width of the channel (106) as shown in FIG. 2a can be increased by decreasing the flow rate of the curable material (103) and/or increasing the flow rate of the non curable material that flows through the channel (102) to be created. The volume is changed as a result of the adjustment of the width of the channel. In a preferred embodiment, the volume of the channel is controlled by adjusting the width of the channel to be created. In a preferred embodiment of the present invention, the width is in the range of 100 nanometers to 10 microns. In a more preferred embodiment of the present invention, the width is in the range of 200 nanometers to 1 micron. In a most preferred embodiment of the present invention, the width is approximately 500 nanometers.

According to an embodiment of the present invention, the apparatus and method for constructing at least one channel of a desired volume within a channel in a substrate is used to provide a channel that has smooth surfaces (for example, no cracks, crevices, wrinkles, bulges, etc.). The smoothness of the channel to be constructed depends on several factors, for example, the fabrication materials. In a preferred embodiment, the material comprises of at least one fluid that is curable and a second fluid that is immiscible with the first fluid. According to another embodiment of the present invention, the curing mechanism can be for example, UV curing, heat, time, chemistry, radiation, and oxidation. Examples of UV curable materials include epoxy acrylate, urethane acrylate, polyester acrylate, acrylated acrylic or other oligomers. In a preferred embodiment of the present invention, the curable material is preferred to have minimal or low shrinkage, for example, Hyperbranched Polyester Acrylate formulations (see reference, Jeffrey A. Klang and James S. Balcerski, "UV Curable Ink Jet Raw Material Challenges", Sartomer, September 2002, page 5054-5058) which is incorporated by reference in its entirety for all purposes. Another criterion regarding the fluid materials is that both fluids should be compatible with the process or assay. Examples of a second fluid include non-UV sensitive material, water, organic solvents, alcohols, etc. One of ordinary skill in the art would recognize many variations, alternatives, and modifications. Alternately, a surface coating can be applied to make the material compatible with the process or assay according to another embodiment of the present invention.

Figure 4A:
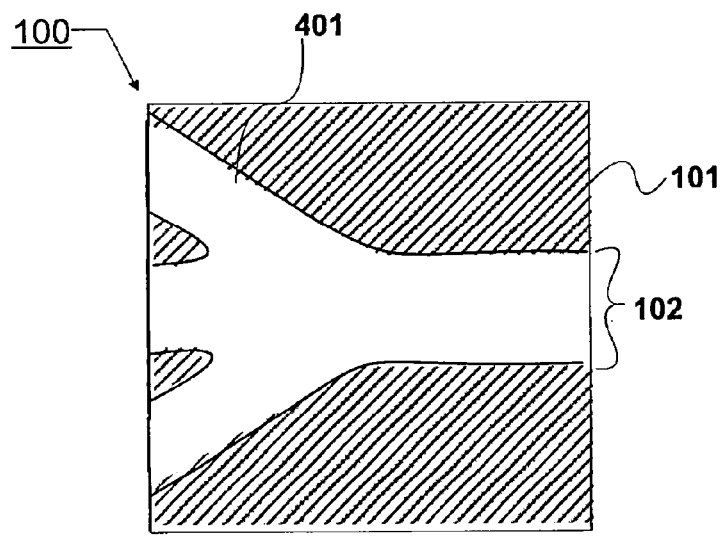
FIGS. 4a-4c illustrate examples of mechanisms to provide introductory channels that supply material into a channel in a substrate according to an embodiment of the present invention.
Figure 4B:
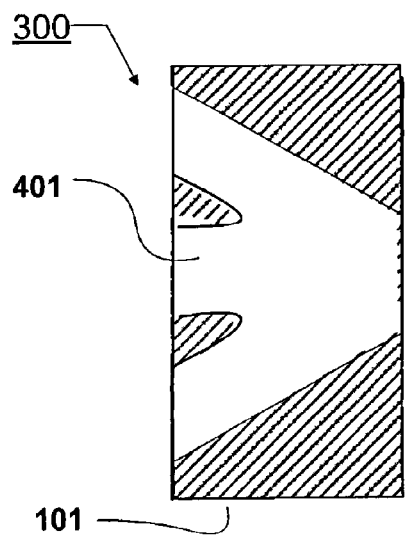
Figure 4C:
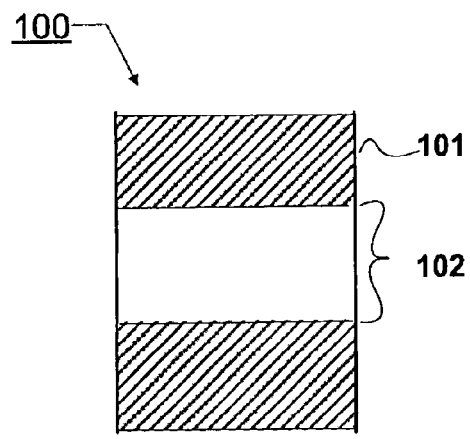

According to another embodiment of the present invention, the fluids are dispensed into the channel at the same time, adjusting the flow rates of the fluids to determine the width of the channel to be constructed as mentioned previously. The fluids flow in parallel through the channel. According to another aspect of the present invention, introductory channels that introduce fluids into the channel in the substrate are provided. Examples of methods to provide the introductory channels are shown in FIGS. 4a-4c according to an embodiment of the present invention. These diagrams are merely examples, which should not unduly limit the scope of the claims. One of ordinary skill in the art would recognize many variations, alternatives, and modifications. In one example as shown in FIG. 4a, the substrate (101) includes both the channel (102) in which the channel of a desired volume will be constructed and the introductory channels (401) to facilitate the dispensing of the fluids into the channel (102). Dispensing mechanisms are well known to one skilled in the art, for example, syringe pumps and the use of air pressure. The dispensing mechanisms may include a plurality of valves and air pressure that control the fluid flow of the liquids into the specific channels. Computer software products are provided to control various active components (for example, valves to control the liquid), temperature and measurement devices according to another embodiment of the present invention. The system may be conveniently controlled by any programmable device, preferably a digital computer such as a Dell personal computer. The computers typically have one or more central processing unit coupled with a memory. A display device such as a monitor is attached for displaying data and programming. A printer may also be attached. A computer readable medium such as a hard drive or a CD ROM can be attached. Program instructions for controlling the liquid handling may be stored on these devices.

According to an alternative embodiment of the present invention, the control element (400) is a separate substrate from the substrate that has the channel in which the channel of a desired volume will be constructed in, for example, as shown in FIG. 4b. The control element (400) can be attached to the substrate with the channel wherein the channel of a desired volume is going to be constructed as shown in FIG. 4c. The introductory channels can be of various configurations (for example, conical, straight, curved, angled, etc.). According to an embodiment of the present invention, the substrate with the channel wherein the channel of a desired volume is going to be created is typically part of a substrate that comprises other microfluidic features, for example, other channels, storage areas, and the like. The drawings of the channels and control elements are simplified in this specification for demonstration purposes. These diagrams are merely examples, which should not unduly limit the scope of the claims. One of ordinary skill in the art would recognize many variations, alternatives, and modifications. The design of a control element can be dependent on the configuration of the substrate with the channel wherein the channel of a desired volume is going to be created. In a preferred embodiment, the control element are temporarily attached to assist in creating the channel(s) of a desired volume(s). Attaching mechanisms are well known in the art for someone skilled in the art, for example, clamping, use of gaskets, and the like.

According to another embodiment of the present invention, a plurality of channels of desired volumes can be created within a channel in a substrate by using a control element (400) multiple times. For example, in creating the three channels of a desired volumes shown in FIG. 5a, a control element (400) similar to the one shown in FIG. 4b can be used to create the first channel by having a non-curable fluid take up the space where additional channels are to be created later according to another embodiment of the present invention. Once the first channel is cured and created, then the same control element may be used again to create additional channels within the same channel in the substrate.

According to an embodiment of the present invention, a dispensing mechanism dispenses a plurality of fluids in an alternating pattern into a channel in a substrate to create multiple channels of a desired volume. FIGS. 5a-5d illustrate an example of a plurality of control elements (400) for constructing multiple channels of a desired volume according to an embodiment of the present invention. These diagrams are merely examples, which should not unduly limit the scope of the claims. One of ordinary skill in the art would recognize many variations, alternatives, and modifications. FIG. 5a illustrates a substrate wherein three channels of a desired volume will be constructed using control elements (FIGS. 5b, 5c, and 5d) that will provide the introductory channels. The control element as shown in FIG. 5b is attached to the side surface, the control element as shown in FIG. 5c is attached to the top surface and the control element as shown in FIG. 5d is attached to the bottom surface of the substrate with the channel wherein the multiple channels will be created (FIG. 5a). The control element (400) as shown in FIG. 5b provides two introductory channels (401b and 401f) that introduces non-curable fluids into two corresponding channels (106b and 106f) in the main substrate (FIG. 5a). The control element (400) as shown in FIG. 5c provides four introductory channels (401a, 401c, 401e and 401g) that introduces curable fluids into four correspond-ing channels (103a, 103c, 103e and 103g) in the main substrate (FIG. 5a). The control element (400) as shown in FIG. 5d provides an introductory channel (401d) that introduces a non-curable fluid into the center channel (106d) in the main substrate (FIG. 5a). In a preferred embodiment of the present invention, all the fluids are introduced at the same time. Once the proper flow of the fluids are formed, the curing process is applied forming the three channels as indicated in FIG. 5a. According to another embodiment of the present invention, the introductory channel that is in the same substrate as the channel of a desired volume is being created is filled with curable material and cured. The mechanisms and concept describe above can also be applied when creating additional multiple channels of a desired volume(s). One of ordinary skill in the art would recognize many variations, alternatives, and modifications.

According to an embodiment of the present invention, an apparatus and method for constructing at least one open microchannel within an open channel in a substrate using a mask are provided. At least one channel with a desired volume in the substrate is constructed. In one aspect of the present invention, the channel to be constructed further comprises a width. In a preferred embodiment, the volume of the channel is controlled by adjusting the width of the channel to be created. In one preferred aspect of the invention, the width is in the range of 1 micron to 50 microns. In a more preferred embodiment of the present invention, the width is in the range of 5 microns to 20 microns. In a most preferred embodiment of the present invention, the width is approximately 10 microns.

Figure 6:
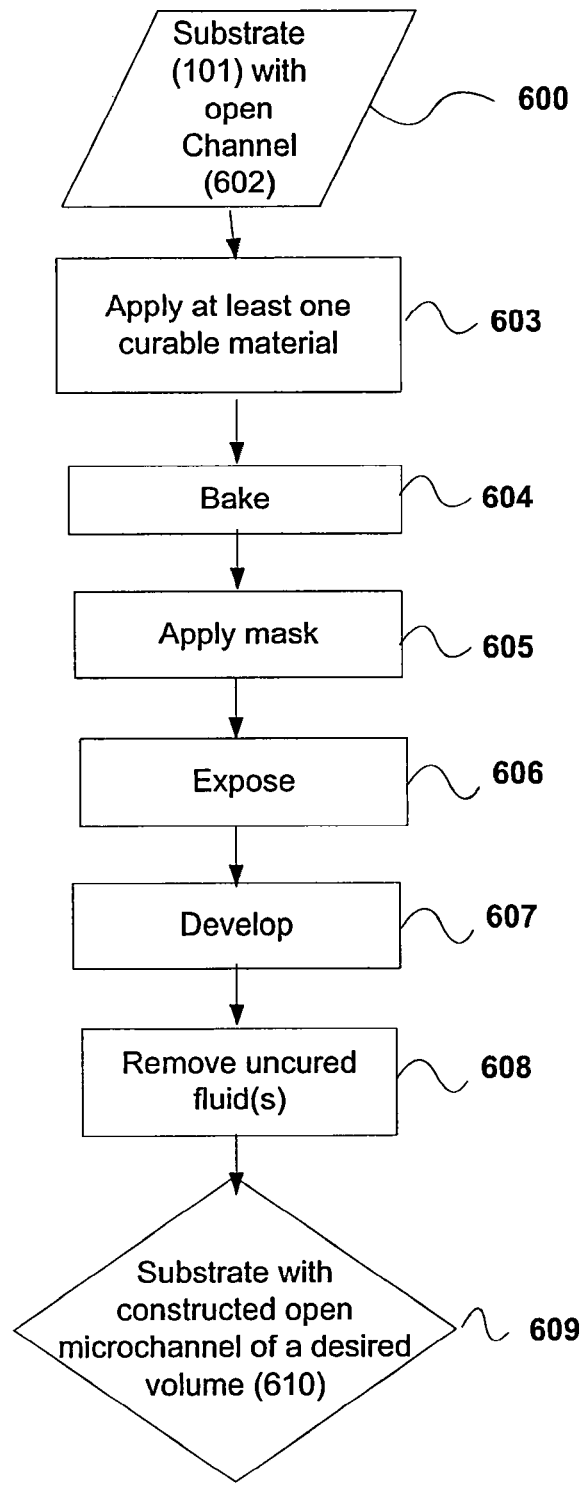
FIG. 6 illustrates an outline showing the steps to construct at least one open microchannel of a desired volume within an open channel in a substrate according to an embodiment of the present invention.
Figure 7A:
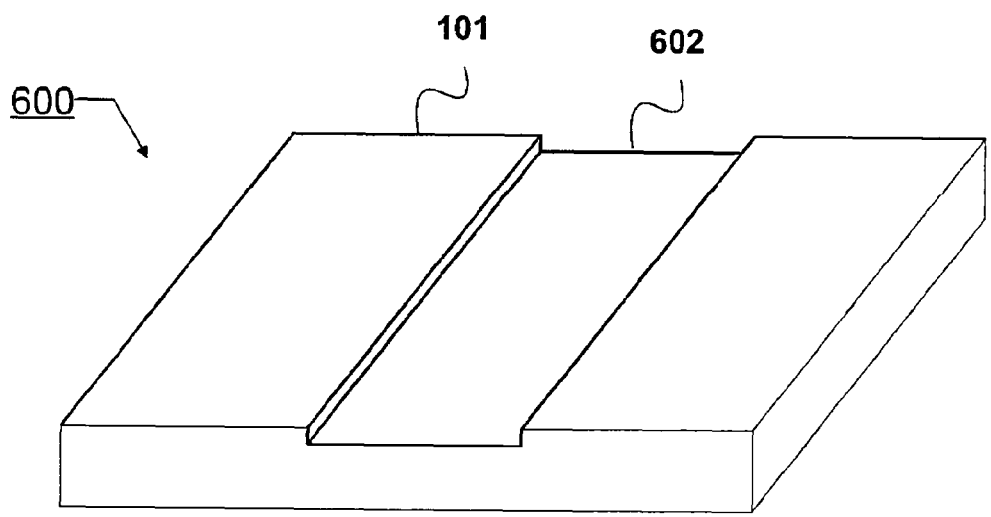
FIGS. 7a-7d illustrate some of the steps involved in creating open microchannels of a desired volume(s) by using a mask and exposure step according to an embodiment of the present invention.
Figure 7B:
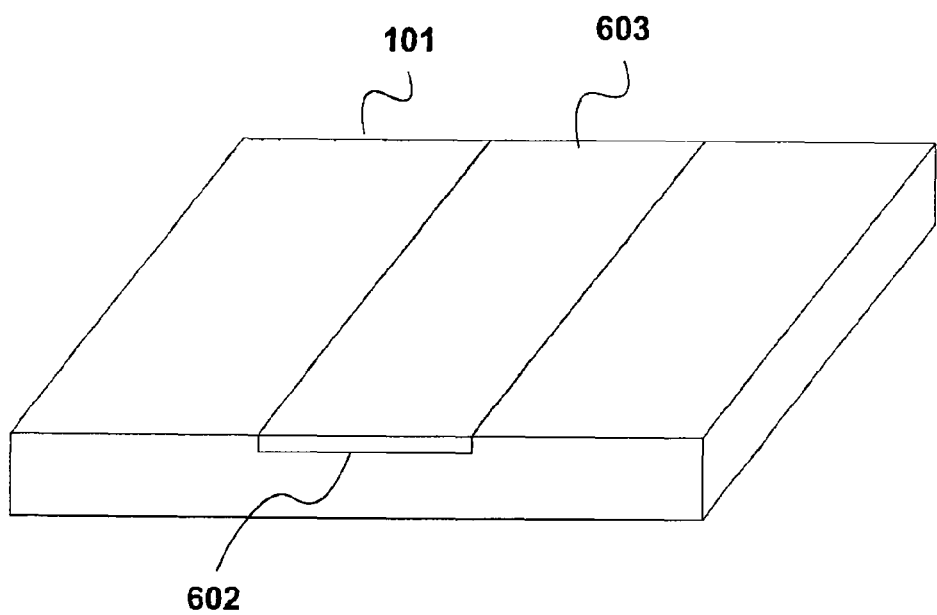
Figure 7C:
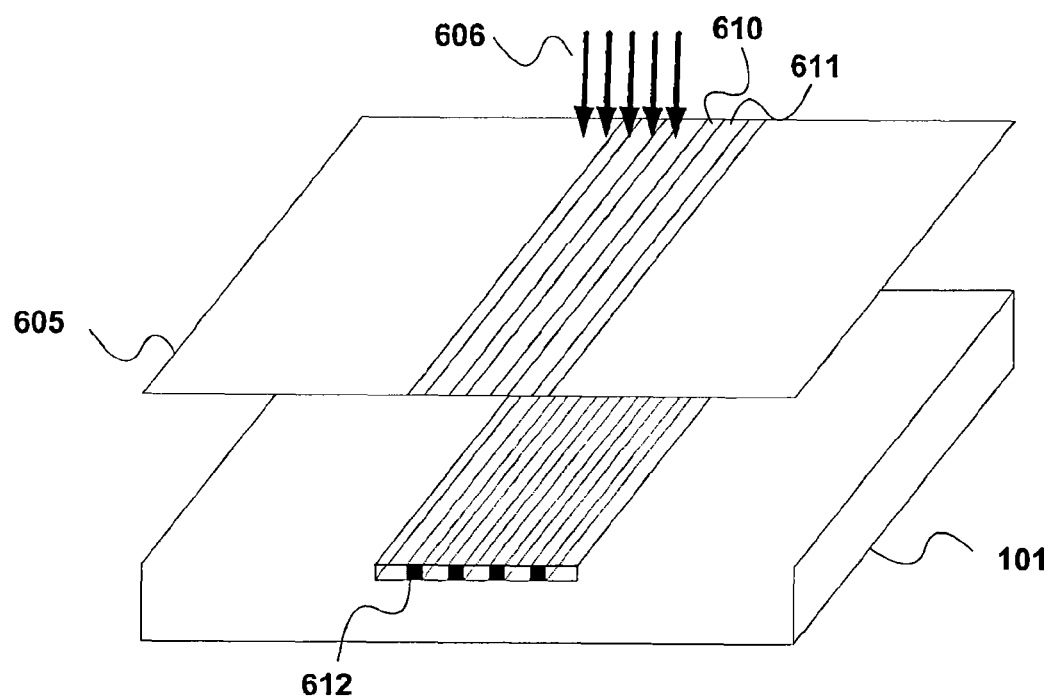
Figure 7D:
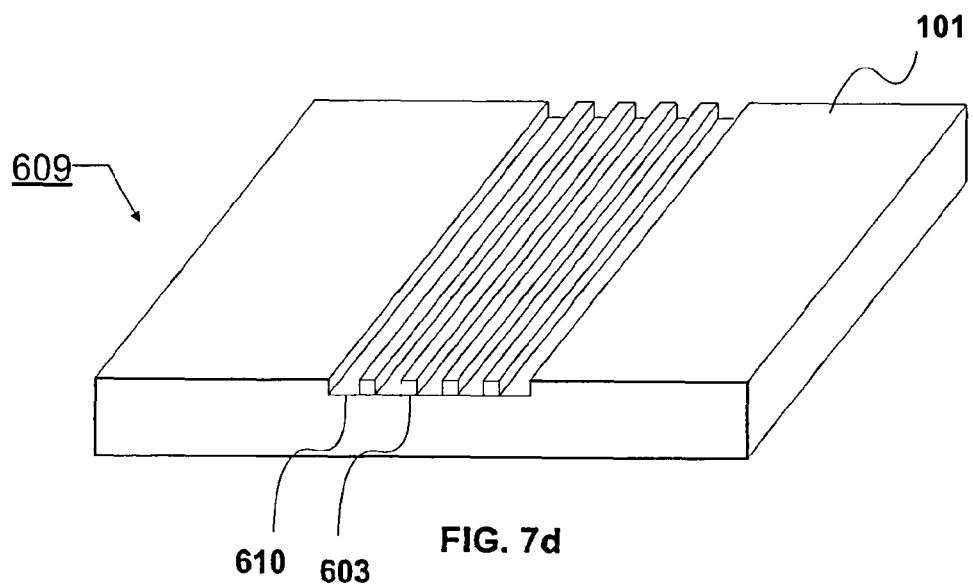

According to one aspect of the present invention, the steps of constructing at least one open microchannel within an open channel in a substrate using a mask is outlined in FIG. 6. The substrate (101) with the open channel (602) is provided (600) and at least one material that is curable is applied to the open channel in the substrate (603). An example of an open channel (602) in a substrate (101) is illustrated in FIG. 7a. The fluid can be, for example, SU-8, photosensitive epoxies, etc. The material can be applied directly into the open channel (602) with a dispensing mechanism, such as those that are well known in the art for someone skilled in the art, for example, spin coating, dip coating, various types of pumps, and gel dispensers. These may be used to dispense a material into the open channel with minimal concerns regarding under and over filling. FIG. 7b illustrates an example of a curable material (603) that is dispensed into an open channel (602) in a substrate (101). The material is baked (604) and then goes through an exposure step. An example of the exposure step in constructing multiple open microchannels according to an embodiment of the present invention, is illustrated in FIG. 7c. Specified areas of the applied fluid material (603) are masked (605) and then exposed to UV light (606). A mask (605) that comprises open (610) and closed areas (611) can be placed over the material such that the desired areas of the material to be cured are exposed (612) when subjected to a UV light (606). Methods and apparatus for carrying out basic photolithographic process has been described in Kovacs, Gregory, "Micromachine Transducers Sourcebook," McGrawHill, pp 20-21, 1998, which is incorporated by reference in its entirety for all purposes. Once the material (603) is developed (607), the uncured material is removed (608). At least one open microchannel of a desired volume (610) within the open channel (602) in the substrate (101) is constructed (609) as shown in FIG. 7d. It is to be understood that the above description is intended to be illustrative and not restrictive. FIGS. 7a-7d are merely examples, which should not unduly limit the scope of the claims. Many variations of the invention will be apparent to those of skill in the art upon reviewing the above description and figures.

According to an embodiment of the present invention, an apparatus for constructing at least one channel of a desired volume in a plastic substrate is provided. At least one fluid that is curable is introduced into a channel in the substrate by a dispensing mechanism. The first fluid flows into the channel in the substrate. A curing mechanism cures at least the first fluid while the fluid is in the channel to create an alternating pattern of the cured fluid to construct at least one channel of a desired volume. The constructed channel comprises of a width which is varied to provide the channel of a desired volume in the substrate.

According to a another embodiment of the present invention, the apparatus further includes a second fluid, wherein the second fluid is immiscible with the first fluid. In one preferred aspect of the invention, the width is in the range of 100 nanometers to 10 microns. In a more preferred embodiment of the present invention, the width is in the range of 200 nanometers to 1 micron. In a most preferred embodiment of the present invention, the width is approximately 500 nanometers. According to another aspect of the present invention, the first fluid, which is curable, is a UV epoxy material which is cured by a UV curing mechanism while the second fluid is water.

According to an alternate embodiment of the present invention, the channel of a desired volume to be created is an open microchannel. In one aspect of the present invention, the apparatus further comprises a mask during the curing process to provide the alternating pattern of the cured material. In one preferred aspect of the invention, the width is in the range of 1 micron to 50 microns. In a more preferred embodiment of the present invention, the width is in the range of 5 microns to 20 microns. In a most preferred embodiment of the present invention, the width is approximately 10 microns. In a preferred embodiment, SU-8 is used to create the cured walls of the microchannels.

According to an embodiment of the present invention, a method for constructing at least one channel of a desired volume in a plastic substrate is provided. At least one fluid that is curable is introduced into a channel in the substrate by a dispensing mechanism. The first fluid flows into the channel in the substrate. A curing mechanism cures at least the first fluid while the fluid is in the channel to create an alternating pattern of the cured fluid to construct at least one channel of a desired volume. The constructed channel comprises of a width which is varied to provide the channel of a desired volume in the substrate.

According to a another embodiment of the present invention, the method further includes a second fluid, wherein the second fluid is immiscible with the first fluid. In one preferred aspect of the invention, the width is in the range of 100 nanometers to 10 microns. In a more preferred embodiment of the present invention, the width is in the range of 200 nanometers to 1 micron. In a most preferred embodiment of the present invention, the width is approximately 500 nanometers. According to another aspect of the present invention, the first fluid, which is curable, is a UV epoxy material which is cured by a UV curing mechanism while the second fluid is water.

According to an alternate embodiment of the present invention, the channel of a desired volume to be created is an open microchannel. In one aspect of the present invention, the method further comprises a mask during the curing process to provide the alternating pattern of the cured material. In one preferred aspect of the invention, the width is in the range of 1 micron to 50 microns. In a more preferred embodiment of the present invention, the width is in the range of 5 microns to 20 microns. In a most preferred embodiment of the present invention, the width is approximately 10 microns. In a preferred embodiment, SU-8 is used to create the cured walls of the microchannels.

All references, including publications, patent applications, patents, cited herein are hereby incorporated by reference to the same extent as if each reference were individually and specifically indicated to be incorporated by reference and were set forth in its entirety herein.

EXAMPLE

Example

Constructing a Microchannel of a Desired Volume

Figure 8:
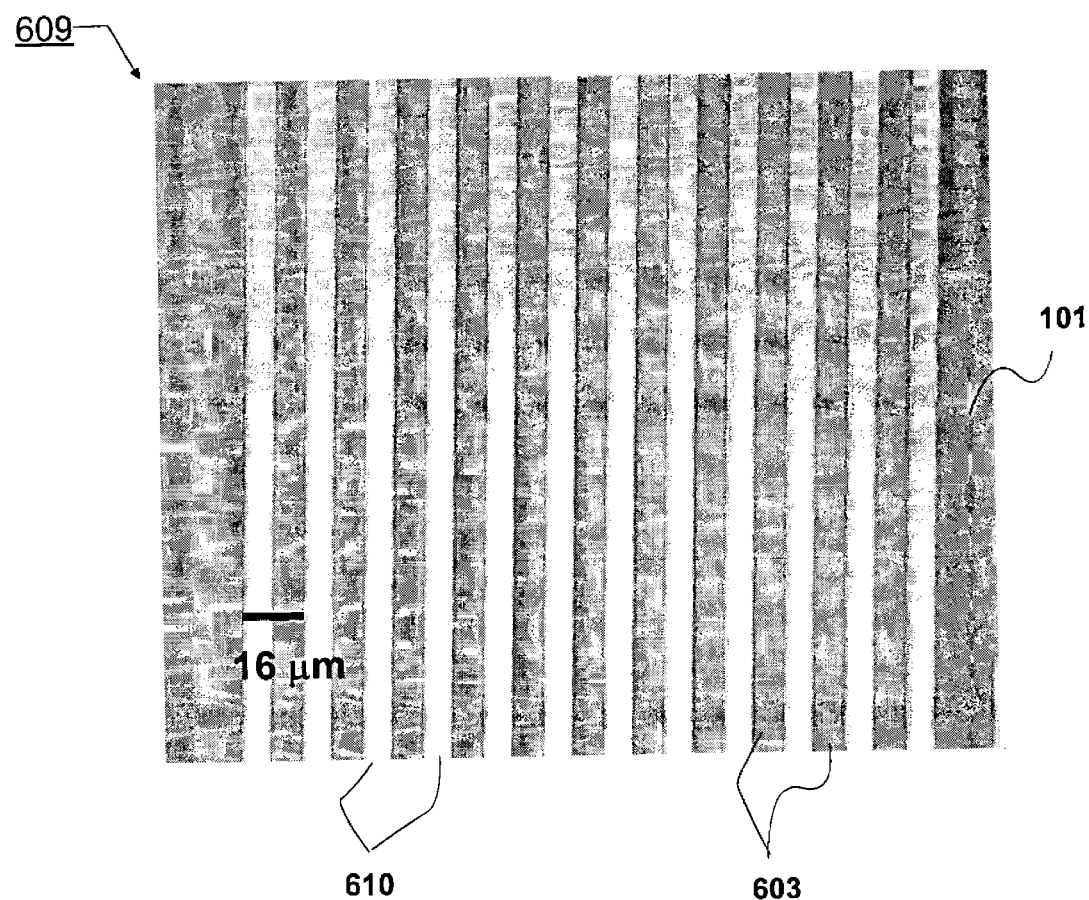
FIG. 8 illustrates a substrate with constructed open microchannels of a desired volume according to an embodiment of the present invention.

An experiment was performed to construct multiple micro channels within an open channel in a substrate. The steps outlined in FIG. 6 were performed to created the open microchannel of a desired volume. An open microchannel (602) in a substrate (101) as shown in FIG. 7a was provided. The open channel microchannel (602) was filled with a photo resist material, Microchem 660 by using a spin coating process (1000 rpm, 30 seconds) and baked at 60 degrees Celsius for 1 hour as illustrated in FIG. 7b. A mask was placed over the material and the material was exposed to UV light (240 mJ/cm$^2$) as shown in FIG. 7c. The photo resist material was developed with 0.26 N Tetramethylammonium Hydroxide (TMAH) for 60 seconds (607) and the uncured material was removed (608). Multiple open microchannels of a desired volume (610) were created (609) as shown in FIG. 8.

III. Conclusion

It is to be understood that the above description is intended to be illustrative and not restrictive. Many variations of the invention will be apparent to those of skill in the art upon reviewing the above description and figures. All cited references, including patent and non-patent literature, are incorporated by reference herein in their entireties for all purposes.

What is claimed is:

1. A method for constructing at least one channel within a preexisting channel of a substrate, the method comprising:
   providing a substrate, wherein the substrate comprises a preexisting channel;
   introducing a first fluid and a second fluid into the preexisting channel through a plurality of introductory channels, wherein introducing the first and second fluids comprises attaching a control element to the substrate, wherein the control element comprises the plurality of introductory channels, and wherein the first and second fluids are immiscible;
   curing the first fluid, wherein curing the first fluid does not cure the second fluid;
   removing the uncured second fluid from the substrate, thereby constructing at least one constructed channel within the preexisting channel; and
   repeating the introducing, curing, and removing steps, thereby constructing at least one additional channel within the at least one constructed channel.

2. The method of claim 1, wherein introducing the first and second fluids is repeated at least once to create an alternating pattern of the first and second fluids within the preexisting channel.

3. The method of claim 1, wherein the first and second fluids are introduced into the preexisting channel in parallel.

4. The method of claim 1, wherein introducing the first and second fluids is performed with at least two different sets of introductory channels.

5. The method of claim 1, wherein the at least one constructed channel comprises a channel width, wherein the first fluid is introduced at a different flow rate than the second fluid, and wherein the channel width is based upon, at least in part, the difference in the flow rate for the first and second fluids.

6. The method of claim 5, wherein the channel width ranges from 100 nanometers to 10 microns.

7. The method of claim 6, wherein the channel width ranges from 200 nanometers to 1 micron.

8. The method of claim 7, wherein the channel width is 500 nanometers.

9. The method of claim 1, wherein the first fluid is curable with ultraviolet radiation, wherein the second fluid is not curable with ultraviolet radiation, and wherein curing the first fluid comprises exposing the first and second fluids within the preexisting channel to ultraviolet radiation.

10. The method of claim 1, wherein the substrate comprises a plastic material.

11. The method of claim 10, wherein the plastic material is selected from the group consisting of polycarbonate, polymethyl methacrylate, and polydimethylsiloxane.

12. The method of claim 1, wherein the at least one constructed channel comprises a shape selected from the group consisting of straight, curved, L shape, V shape, funnel, and zigzag.

* * * * *